(12) United States Patent
Schleser et al.

(10) Patent No.: US 11,002,786 B2
(45) Date of Patent: May 11, 2021

(54) DEVICE AND METHOD FOR DIAGNOSING THE DETECTION OF A MULTI-PHASE ELECTRIC CURRENT

(71) Applicant: Robert Bosch GmbH, Stuttgart (DE)

(72) Inventors: Roland Schleser, Abstatt (DE);
Stephan Hanel, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 63 days.

(21) Appl. No.: 16/344,391

(22) PCT Filed: Oct. 4, 2017

(86) PCT No.: PCT/EP2017/075140
§ 371 (c)(1),
(2) Date: Apr. 24, 2019

(87) PCT Pub. No.: WO2018/077582
PCT Pub. Date: May 3, 2018

(65) Prior Publication Data
US 2020/0049759 A1    Feb. 13, 2020

(30) Foreign Application Priority Data

Oct. 25, 2016    (DE) .................... 10 2016 220 948.5

(51) Int. Cl.
*G01R 35/00*  (2006.01)
*G01R 31/28*  (2006.01)
*G01R 19/00*  (2006.01)

(52) U.S. Cl.
CPC ..... *G01R 31/2829* (2013.01); *G01R 19/0092* (2013.01); *G01R 35/00* (2013.01)

(58) Field of Classification Search
CPC .... G01R 1/203; G01R 19/0092; G01R 19/04; G01R 19/155; G01R 19/2513; G01R 35/00
See application file for complete search history.

(56) References Cited

U.S. PATENT DOCUMENTS

| | | | |
|---|---|---|---|
| 5,357,181 A * | 10/1994 | Mutoh | B60L 3/0038 318/139 |
| 2001/0013771 A1* | 8/2001 | Wasmer | G01R 19/155 324/86 |

(Continued)

FOREIGN PATENT DOCUMENTS

| | | |
|---|---|---|
| CH | 708761 | 4/2015 |
| DE | 102012217116 | 3/2014 |

OTHER PUBLICATIONS

International Search Report for Application No. PCT/EP2017/075140 dated Dec. 13, 2017 (English Translation, 3 pages).

*Primary Examiner* — Thang X Le
(74) *Attorney, Agent, or Firm* — Michael Best & Friedrich LLP

(57) ABSTRACT

The present invention relates to the analysis of current sensor signals of a multi-phase electrical system. According to the invention, signal paths between a current sensor element and a measuring device are coupled to a predetermined electric potential for a short time. A change in the subsequent measurement results can then be analyzed to see if they are indicative of a possible malfunction during the measurement.

9 Claims, 3 Drawing Sheets

(56) References Cited

U.S. PATENT DOCUMENTS

| | | | |
|---|---|---|---|
| 2008/0265809 A1* | 10/2008 | Oi | H02P 21/06 |
| | | | 318/139 |
| 2013/0057307 A1 | 3/2013 | Fischer | |
| 2014/0159756 A1 | 6/2014 | Ueno et al. | |
| 2015/0002112 A1* | 1/2015 | Tang | H02H 7/1213 |
| | | | 323/271 |
| 2015/0015235 A1 | 1/2015 | Brendel | |
| 2015/0185279 A1 | 7/2015 | Milano et al. | |
| 2016/0178687 A1* | 6/2016 | Yamamoto | H01H 71/10 |
| | | | 324/538 |
| 2017/0237375 A1* | 8/2017 | Pramod | H02P 27/08 |
| | | | 318/400.02 |

* cited by examiner

DEVICE AND METHOD FOR DIAGNOSING THE DETECTION OF A MULTI-PHASE ELECTRIC CURRENT

BACKGROUND OF THE INVENTION

The present invention relates to a device for diagnosing a detection of a polyphase electric current, and to a method for diagnosing sensor signals of a detected polyphase electric current.

For the regulation of electrical machines in electrical drive systems, the phase currents of the electrical machine are set. This necessitates continuously detecting the phase currents and subsequently regulating said phase currents for setting a predefined setpoint torque. Errors in the detection of the electric phase currents can lead to an undesired acceleration or deceleration of the electrical machine. Therefore, the plausibility of the detected phase currents has to be verified.

The document DE 10 2012 217 116 A1 discloses a method for determining the phase currents of an electrical machine with a power convertor. Said document proposes, in particular, not detecting the currents in all the electrical phases metrologically, but rather determining the phase currents of some phases computationally.

SUMMARY OF THE INVENTION

The present invention discloses a device for diagnosing a detection of a polyphase electric current and a method for diagnosing sensor signals of a detected polyphase electric current.

Accordingly, provision is made of:

A device for diagnosing a detection of a polyphase electric current comprising a current sensor, a measuring unit, a test unit and a monitoring unit. The polyphase electric current can be for example an electric current having at least three or possibly even more phases. The current sensor is designed to measure electric phase currents in the phases of the polyphase electric current to be detected. In this case, it is possible to measure the electric currents in all the phases of the polyphase electric current. Furthermore, the current sensor is designed to provide a corresponding sensor signal for each measured phase current. In this case, the corresponding sensor signals are provided at output terminals of the current sensor. The measuring unit comprises a plurality of input terminals, wherein an input terminal is respectively electrically coupled to an output terminal of the current sensor. The measuring unit is designed to detect signals provided at the input terminals. The detected signals at the input terminals of the measuring unit can be evaluated by the measuring unit. The measuring unit can thereupon provide output signals in analog or digital form which correspond to the detected signals at the input terminals. The test unit is electrically coupled to at least one first input terminal of the input terminals of the measuring unit. In this case, the test unit is designed to couple the first input terminal of the measuring unit to a predefined voltage potential for a predetermined time period. In this case, the input terminal can be coupled to the predefined voltage potential in particular via an ohmic resistance or an impedance. The monitoring unit is designed to detect a malfunction of the detection of the polyphase electric current if the signal received by the measuring unit deviates from a predetermined value range while the test unit couples the first input terminal of the measuring unit to the predefined voltage potential. For this purpose, the monitoring unit can for example receive an output signal corresponding to the signal present at the first input terminal from the measuring unit and compare said output signal with a predefined value range. It goes without saying that the comparison of the signal received by the measuring unit with the predetermined value range can also be carried out in any further manner desired.

Furthermore, provision is made of:

A method for diagnosing sensor signals of a detected polyphase electric current in which the sensor signals are provided at input terminals of a measuring unit. The method comprises a step for electrically coupling a first input terminal of the measuring unit to a predefined voltage potential for a predetermined time period. Furthermore, the method comprises a step for determining a value for a signal present at the first input terminal of the measuring unit, and a step for detecting a malfunction during the detection of the polyphase electric current if, during the coupling of the first input terminal to the predefined voltage potential, the value of the signal at the first input terminal deviates from a predetermined value range.

The present invention is based on the insight that the correct detection of phase currents for example during the regulation of electrical drive systems or else, if appropriate, further polyphase electrical systems is accorded great importance. On account of aging, faulty reference voltages or numerous further faults, inaccuracies or errors can occur during the detection of the phase currents. However, erroneously or inaccurately detected current values can lead to disturbances and instabilities during the regulation of an electrical system.

The present invention is therefore based on the concept of taking account of this insight and providing a diagnosis during the detection of phase currents of a polyphase electrical system. In this case, the present invention takes into consideration, in particular, the fact that during a complete detection of all the phase currents of a polyphase electrical system, such a system is overdetermined on account of Kirchhoff's law. Therefore, the sensor signal of a current sensor of one phase can in each case be coupled momentarily to a predefined voltage potential and a significantly deviating value can thus be deliberately set. This deliberately set deviation can thereupon be detected in order thus to infer a correct function in the path of the detection of the respective phase current. If in this case during the coupling of a corresponding measurement input to a predefined voltage potential an adequate deviation of the corresponding value in the signal path is detected, then a correct function can be assumed. Otherwise, this is an indication of a disturbance during the detection of the phase currents.

The respective present phase current for that phase whose signal path is coupled to the predefined voltage potential can be calculated from the other phase currents in this case on the basis of Kirchhoff's law. Consequently, the information about all the phase currents is still available even during the checking of the metrological detection of one phase current. Therefore, the diagnosis of the detection of the phase currents can be carried out during the course of operation, without the overall system being adversely affected in the process.

In accordance with one embodiment, the measuring unit is designed to calculate a value for the electric phase current whose corresponding sensor signal is provided at the first input terminal. Since in each case only one input terminal of the measuring unit is coupled to a predefined voltage potential, the value of the phase current whose input terminal is presently being checked can be calculated from the remaining values of the phase currents. Consequently, the values of all the phase currents are always available.

In accordance with one embodiment, the test unit is designed to adapt the predetermined time period for coupling the input terminal of the measuring unit to a voltage potential depending on a period duration of the polyphase electric current. In particular, the coupling of an input terminal of the measuring unit to a predefined voltage potential can be set here for a predefined part of the period duration of the polyphase electric current. By way of example, in the case of a three-phase system, an input terminal of the measuring unit can be coupled to the predetermined voltage potential for one third or one sixth of a period duration.

In accordance with one embodiment, the measuring unit comprises an output terminal designed to provide a predefined voltage potential. Said output terminal can be electrically coupled to the first input terminal of the measuring unit. In this way, by means of setting the predefined voltage potential at the output terminal, the first input terminal of the measuring unit can be coupled to the corresponding voltage potential. By way of example, the measuring unit can be an integrated circuit such as a microcontroller or the like, for example, which, besides signal inputs, also has one or more terminals that can be connected as outputs.

In accordance with one embodiment, the test unit is designed to couple a respective input terminal of the measuring unit to a predefined voltage potential for a predetermined time period. In this case, the monitoring unit can be designed to detect a malfunction of the detection of the polyphase electric current if the signal received by the measuring unit deviates from a predetermined value range while the test unit couples the respective input terminal of the measuring unit to the predefined voltage potential. In this way, all input terminals of the measuring unit and the signal paths corresponding thereto can be checked successively.

In accordance with one embodiment, the test unit is designed, during a period duration of the polyphase electric current, to couple each input terminal of the measuring unit to the predefined voltage potential for a predetermined time period. All input terminals of the measuring unit can be checked reliably in this way.

In accordance with one embodiment, the measuring unit couples in each case a maximum of one input terminal of the measuring unit to the predefined voltage potential. In this way, it is possible to ensure that even during the checking of the input terminals of the measuring unit and the corresponding signal paths, all values of the phase currents can always be determined.

In accordance with one embodiment, the predetermined voltage potential comprises a reference potential. Furthermore, the predetermined potential can also additionally or alternatively comprise a fixed voltage potential deviating from a reference potential. In this case, the coupling between the predetermined voltage potential and the input terminal of the measuring unit can be carried out via an electrical resistance, in particular. If the respective input terminal of the measuring unit is simultaneously coupled in each case via a resistance to the reference potential and a fixed voltage potential deviating therefrom, then a voltage divider results therefrom. By means of a voltage divider, here in a wide range it is possible to set a desired voltage value at the respective input terminal of the measuring unit.

The above configurations and developments can, insofar as is practical, be combined with one another in any desired manner. Further configurations, developments and implementations of the invention also encompass not explicitly mentioned combinations of features of the invention described above or below in respect of the exemplary embodiments. In particular, the person skilled in the art here will also add individual aspects as improvements or supplementations to the respective basic forms of the invention.

BRIEF DESCRIPTION OF THE DRAWINGS

The present invention is explained in greater detail below on the basis of the exemplary embodiments indicated in the schematic figures of the drawings, in which.

DETAILED DESCRIPTION

Figure 1:
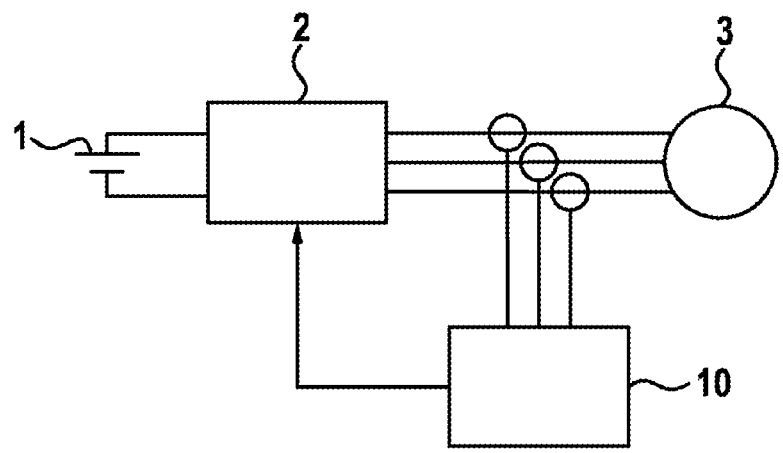
FIG. 1: shows a schematic illustration of a polyphase electrical drive system with a device for diagnosing the detection of a polyphase electric current in accordance with one embodiment.

FIG. 1 shows a schematic illustration of an electrical drive system with a device 10 for diagnosing a detection of a polyphase electric current. The electrical drive system comprises a polyphase electrical machine 3. Said polyphase electrical machine 3 is fed by an electrical power convertor 2. In this case, the electrical power convertor 2 can draw its electrical energy from a DC voltage source 1, for example. The DC voltage source 1 can be the traction battery of an electric or hybrid vehicle, for example. In this way, it is possible to realize an electrical drive for such an electric or hybrid vehicle. If a predefined torque is intended to be set in the electrical machine 3, then for this purpose, by means of suitable current sensors, for example, it is possible to detect the phase currents in the phases between the power convertor 2 and the electrical machine 3. Said phase currents can be evaluated by a control device 4. On the basis of the evaluation of the phase currents and a predefined torque, the control device 4 can generate suitable control signals for the power convertor 2 in order to set the predefined setpoint value in the electrical machine 3.

In order to prevent a malfunction, in particular undesired acceleration or deceleration of the electrical machine 3, the detected phase currents can be verified in this case. If an error is detected here during the detection of the phase currents, then it is possible, if appropriate, to stop the regulation of the electrical drive system, in order to prevent greater damage on account of a malfunction. If appropriate, during the verification of the detected phase currents, it may also be possible to determine a deviation between a determined magnitude of the detected phase currents and an actual value of the detected phase currents. If appropriate, a correction factor or a correction function can be determined on the basis of this deviation. Using said correction factor or said correction function, the control device 4 can thereupon calculate the actual phase currents. A further regulation of the electrical drive system can be carried out on the basis of these corrected actual phase currents.

Figure 2:
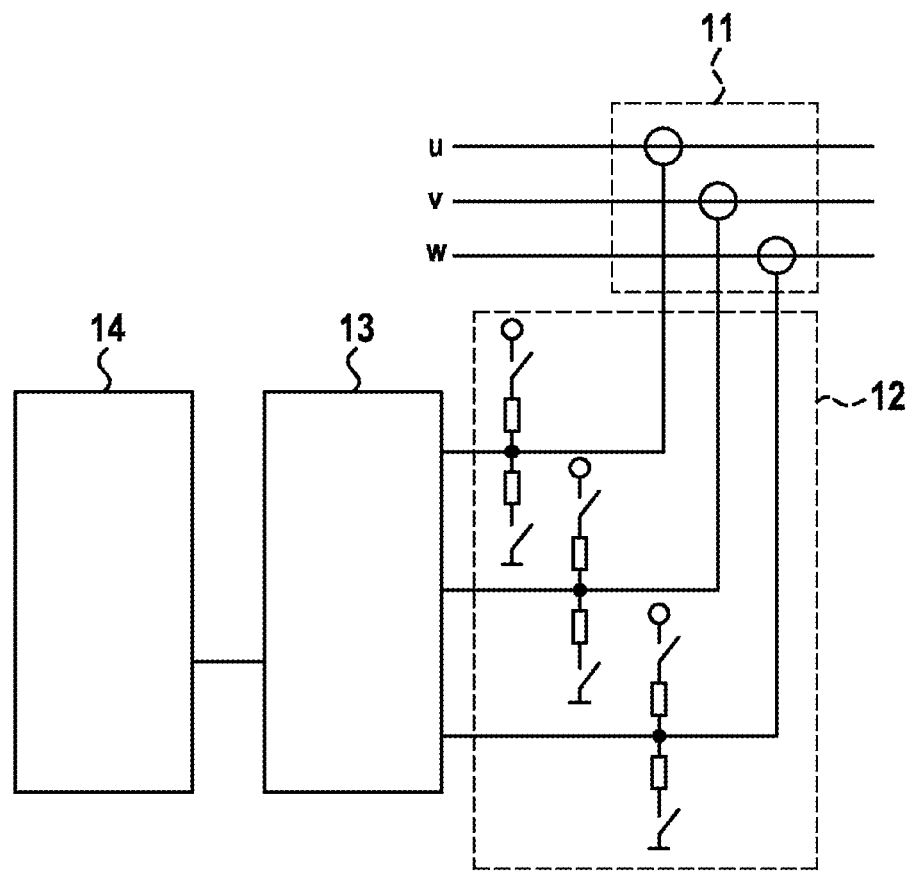
FIG. 2: shows a schematic illustration of a device for diagnosing a detection of a polyphase electric current in accordance with one embodiment.

FIG. 2 shows a schematic illustration of a device 10 for diagnosing a detection of a polyphase electric current in accordance with one embodiment. The device 10 comprises a current sensor 11, a test unit 12, a measuring unit 13 and a monitoring unit 14. The current sensor 11 detects the electric phase currents in the phases U, V and W. For this purpose, the current sensor 11 can comprise a sensor element for example for each phase U, V, W, which sensor element provides a signal corresponding to the electric current flowing in the respective phase U, V, W. The output signal of each sensor element of the current sensor 11 can respectively be connected to an input of the measuring unit 13. By way of example, each sensor element of the current sensor 11 can output a voltage signal corresponding to the electric current flowing in the respective phase U, V, W. Said voltage signal can be detected by the corresponding input of the measuring unit 13 and, if appropriate, be digitized. The signal thus detected and, if appropriate, digitized can thereupon be used further for further processing, in particular regulation of an electrical drive system or the like. By means of the test unit 12, the inputs of the measuring unit 13 can be coupled to a predefined voltage potential. Here in each case a maximum of one input terminal of the measuring unit 13 is coupled to a predefined voltage potential. The coupling of an input terminal of the measuring unit 13 to a predefined voltage potential can be carried out for example by means of the closing of a switching element. For this purpose, the corresponding switching element can be connected via an electrical resistance to the corresponding voltage potential, on the one hand, and the respective input terminal of the measuring unit 13, on the other hand. In particular, it is also possible to form a voltage divider constituted from at least two electrical resistances, wherein a first resistance is connected via a first switching element to a first voltage potential, for example a reference potential, and a further electrical resistance is connected via a further switching element to a further voltage potential, for example a voltage potential that is different than the reference potential. If both switching elements of this voltage divider are closed in this case, then a corresponding voltage value is established at the node of the two resistances which is connected to the input terminal of the measuring unit 13.

Instead of a switching element in the test unit 12, the coupling of an input terminal of the measuring unit 13 to a voltage potential can also be carried out by means of an output terminal of an integrated circuit, in particular an output terminal of the measuring unit 13. If the measuring unit 13 has for example one or more terminals that can be connected as output terminal, then these output terminals can be used to output a predefined voltage potential in order thereby to impinge on the corresponding input terminals of the measuring unit 13.

If an input terminal of the test unit 12 is coupled to a predefined voltage potential in one of the ways described above, then this has an influence on the value of the voltage present at the corresponding input terminal of the measuring unit 13. This corresponding change in the voltage value at the respective input terminal of the measuring unit 13 can be detected by the monitoring unit 14. If the monitoring unit 14 ascertains that when the corresponding input terminal of the measuring unit 13 is connected to the predefined voltage potential, the measuring unit 13 detects a value corresponding to a predefined value range to be expected, then a correct function of the measuring unit can be inferred therefrom. However, if, when the input terminal of the measuring unit 13 is coupled to the predefined voltage potential, the monitoring unit 14 cannot detect a value corresponding to a predefined value range to be expected, then this is an indication of a malfunction. This may indicate for example a fault within the measuring unit 13 or else outside the measuring unit 13.

For the checking described, the voltage at the input terminals of the measuring unit 13 can be set to a value lying outside a value range such as occurs during regular operation for detecting the phase currents. As a result, it is possible rapidly to differentiate between the regular measurement values and the test values during the coupling to the predefined voltage potential. Alternatively, it is also possible, by means of a corresponding choice of the predefined voltage potential and/or of the resistances between voltage potential and input terminal of the measuring unit 13 during the coupling, to set a voltage value which lies within the regular value range such as also occurs during the detection of the phase currents.

If, as a result of the coupling of an input of the measuring unit 13 to a predefined voltage potential, the corresponding input of the measuring unit 13 is set to a known voltage, then the monitoring unit 14 can compare the value detected by the measuring unit 13 with the known value present at the corresponding input. If appropriate, a correction factor or a correction function can be calculated therefrom in order to compensate for aging effects or the like possibly occurring in the measuring unit 13.

While an input terminal of the measuring unit 13 is coupled to a predefined voltage potential by the test unit 12, the value of an electric current for the phase which is intended to be monitored by the corresponding input of the measuring unit 13 can be calculated from the values of the other phases. On the basis of Kirchhoff's law, the sum of all the phase currents always yields zero. In this way, all the phase currents can thus be determined very easily, even if one measurement input is momentarily set to a deviating value by the test unit.

In this case, the time period in which the test unit 12 couples an input of the measuring unit 13 to a predefined voltage potential generally corresponds to a fraction of the period duration of an AC voltage of the polyphase current to be detected. In the case of an n-phase electrical system, here one input of the measuring unit 13 can be coupled to the predefined voltage value in each case for the time duration of T/n or T/(2×n), while for the rest of time the corresponding input is in each case exclusively connected to the corresponding element of the current sensor 11. Here T is the period duration of the polyphase electric current.

By way of example, all input terminals of the measuring unit 13 which are coupled to a sensor element of the current sensor 11 can be coupled to a predefined voltage potential alternately by the test unit 12. In this case, however, always a maximum of one input of the measuring unit 13 is coupled to the predefined voltage potential, while the rest of the inputs are connected to the corresponding sensor elements in an uninfluenced manner. In this way, the correct value of all the phase currents can always be determined on the basis of Kirchhoff's law described above.

Figure 3:
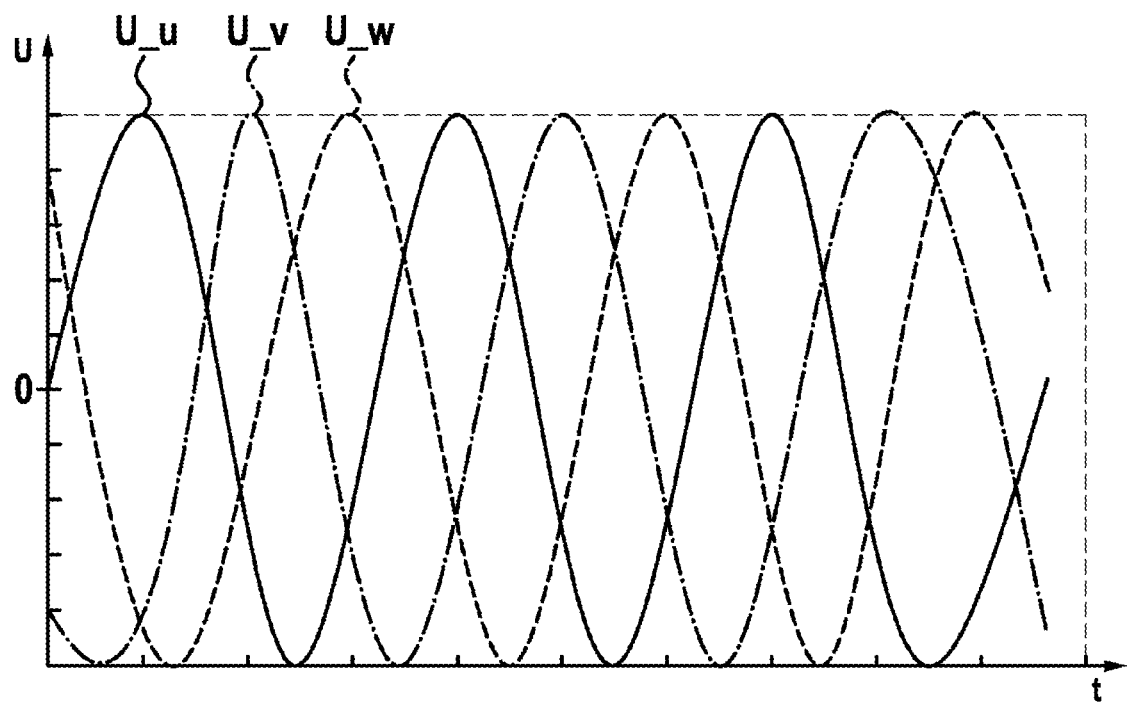
FIG. 3: shows a voltage-time diagram for the profile of a polyphase electric current.

FIG. 3 shows a schematic illustration of the profile of the electric currents U_u, U_v and U_w in a polyphase electrical system having three phases. The currents between the individual phases here are phase-offset by 120° in each case. Here the sum of all currents in all the phases together gives 0 A in each case. For this reason, the value of the electric current of a phase can also always be calculated from the remaining two phases.

Figure 4:
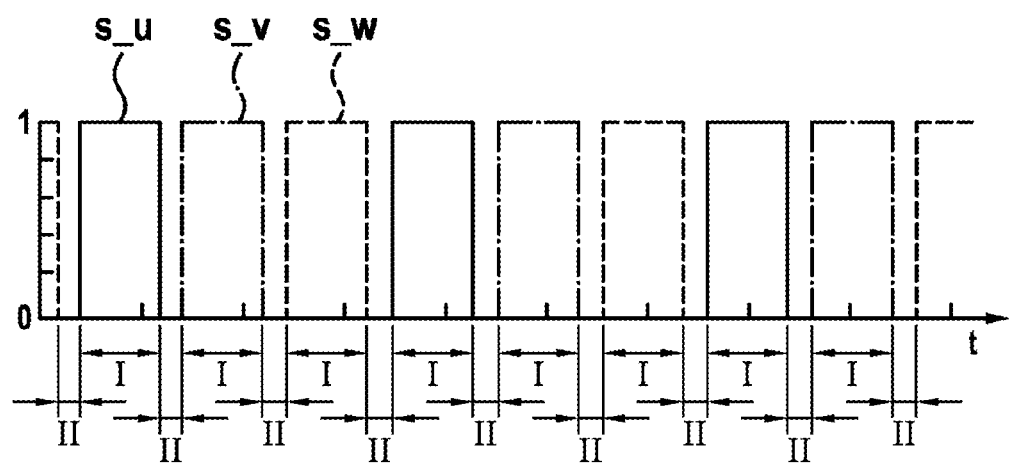
FIG. 4: shows a schematic illustration of a signal profile of control signals in a device for diagnosing the detection of a polyphase electric current in accordance with one embodiment.

FIG. 4 shows a schematic illustration for the driving signals s_u, s_v and s_w of the switching elements for coupling the input terminals of the measuring unit 13 to a predefined voltage potential. As can be discerned here, in each case a maximum of one input terminal of the measuring unit 13 is coupled to the predefined voltage potential, while all the remaining input terminals can in each case detect the output signals of the corresponding sensor elements of the current sensor 11. Here in each period of the phase current in each case for a predefined time period, one input terminal of the measuring unit 13 is coupled to the predefined voltage potential. This sequence can be repeated in each period, as illustrated here. However, it is also possible for the checking not to be performed in each period, rather for example one or more periods can also follow without checking.

In the profile illustrated in FIG. 4, there exist here time periods I in which one input terminal of the measuring unit 13 is coupled to a voltage potential. Furthermore, there also exist time periods II in which no input terminal 13 is coupled to a voltage potential, rather all input terminals are connected only to the corresponding sensor elements of the current sensor 11 and a complete detection of all the phase currents is thus carried out. Multiplex operation can be realized in this way. In this multiplex operation, in a first time segment, all the electric currents are determined on the basis of the sensor signals of all the sensor elements of the current sensor 11. In this case, by means of Kirchhoff's law, it is possible to check whether the sensor signals are plausible, i.e. that the sum of all the electric currents yields zero. In a further time segment, a respective input terminal 13 can be coupled to a voltage potential. The respective signal path can be checked as a result. The processes in the two time segments described above alternate here in multiplex operation.

The embodiments above have been described in association with a three-phase electrical system. Furthermore, the principle according to the invention can, however, be extended to any desired number of more than three phases.

Figure 5:
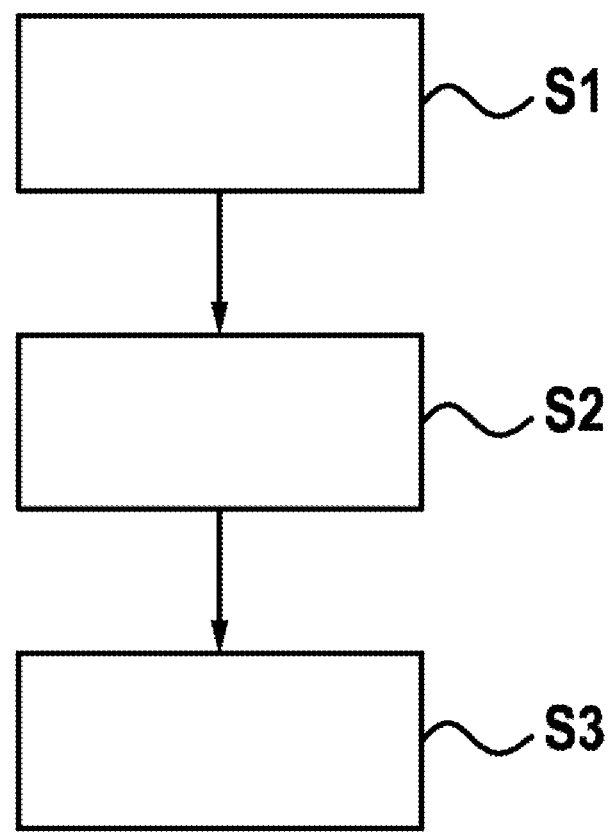
FIG. 5: shows a schematic illustration of a flow diagram such as forms the basis of a method for diagnosing sensor signals of a detected polyphase electric current.

FIG. 5 shows a schematic illustration of a flow diagram such as forms the basis of a method for diagnosing sensor signals of a detected polyphase electric current. In this case, the sensor signals to be diagnosed are provided at input terminals of a measuring unit 13. The method comprises a step for electrically coupling an input terminal of the measuring unit 13 to a predefined voltage potential. The coupling to the predefined voltage potential can be carried out here in particular for a predetermined time period. Step S2 thereupon involves determining a value of the signal present at the corresponding input of the measuring unit. Afterward, step S3 involves detecting a malfunction during the detection of the polyphase electric current if, during the coupling of the input terminal to the predefined voltage potential, the value of the signal at the input terminal deviates from a predetermined value range. If such a malfunction is detected, then it is possible, if appropriate, to determine a correction factor or a correction function in order to adapt a value determined by the measuring unit for a signal present at the corresponding input terminal by means of the correction factor or the correction function. In this case, the correction function or the correction value can be determined with knowledge of the known predefined voltage potential at the input terminal of the measuring unit 13.

To summarize, the present invention relates to the checking of current sensor signals of a polyphase electrical system. For this purpose, the signal paths between a current sensor element and a measuring unit are momentarily coupled to a predefined electrical potential. A change in the downstream measurement value detection can thereupon be evaluated in order to infer a possible malfunction during the detection.

The invention claimed is:

1. A device for diagnosing a detection of a polyphase electric current, the device comprising:
   a current sensor (11) configured to measure electric phase currents in the phases of the polyphase electric current and to provide sensor signals corresponding to the measured phase currents at output terminals;
   a measuring unit (13), comprising a plurality of input terminals, wherein each input terminal is respectively electrically coupled to an output terminal of the current sensor (11), and wherein the measuring unit (13) is configured to detect the sensor signals provided at the input terminals;
   a test unit (12), electrically coupled to a first input terminal of the input terminals of the measuring unit (13) and configured to couple the first input terminal of the measuring unit (13) to a predefined voltage potential for a predetermined time period; and
   a monitoring unit (14) configured to determine a malfunction in the detection of the polyphase electric current based on the signal received by the measuring unit (13) deviating from a predetermined value range in response to the test unit (12) coupling the first input terminal of the measuring unit (13) to the predefined voltage potential.

2. The device as claimed in claim 1, wherein the measuring unit (13) is configured to calculate a value for the electric phase current and wherein the measuring unit (13) generates a corresponding sensor signal and provides the corresponding sensor signal at the first input terminal.

3. The device as claimed in claim 1, wherein the test unit (12) is configured to adapt the predetermined time period for coupling the first input terminal of the measuring unit (13) to a voltage potential depending on a period duration of the polyphase electric current.

4. The device as claimed in claim 1, wherein the test unit (12) comprises an output terminal electrically coupled to the first input terminal of the measuring unit (13), wherein the test unit (12) is configured to set a predetermined voltage potential at the output terminal.

5. The device as claimed in claim 1, wherein the test unit (12) is configured to couple a respective input terminal of the measuring unit (13) to a predefined voltage potential for a predetermined time period; and
   wherein the monitoring unit (14) is configured to detect a malfunction of the detection of the polyphase electric current when the signal received by the measuring unit (13) deviates from a predetermined value range while the test unit (12) couples the respective input terminal of the measuring unit (13) to the predefined voltage potential.

6. The device as claimed in claim 5, wherein the test unit (12) couples each input terminal of the measuring unit (13) to the predefined voltage potential for a predetermined time period during a period duration of the polyphase electric current.

7. The device as claimed in claim 6, wherein the measuring unit (13) couples only one input terminal of the measuring unit (13) to the predefined voltage potential.

8. The device as claimed in claim 1, wherein the predetermined voltage potential comprises a reference potential, a fixed voltage potential deviating from the reference potential, or both the reference potential and the fixed voltage potential.

9. A method for diagnosing a detection of a polyphase electric current, the method comprising:
- measuring, via a current sensor (11) an electric phase current in the phases of the polyphase electric current to be detected and to provide a sensor signal corresponding to the measured phase current;
- electrically coupling (S1) an input terminal of a measuring unit (13), to a predefined voltage potential for a predetermined time period, such that the predefined voltage is applied to the sensor signal present at the input terminal of the measuring unit (13);
- determining (S2) a value for the sensor signal;
- determining (S3), via a monitoring unit a malfunction in the detection of the polyphase electric current based on the value of the sensor signal at the input terminal deviating from a predetermined value range in response to the coupling of the input terminal to the predefined voltage potential.

* * * * *